(12) United States Patent
Panton et al.

(10) Patent No.: US 6,597,309 B1
(45) Date of Patent: Jul. 22, 2003

(54) MICROWAVE PULSE GENERATOR AND PULSE-ECHO RANGING SYSTEM

(75) Inventors: Stanley Panton, Peterborough (CA); Bogdan Cherek, Peterborough (CA)

(73) Assignee: Siemens Milltronics Process Instruments Inc., Peterborough (CA)

( * ) Notice: Subject to any disclaimer, the term of this patent is extended or adjusted under 35 U.S.C. 154(b) by 0 days.

(21) Appl. No.: 09/367,498

(22) PCT Filed: Feb. 17, 1998

(86) PCT No.: PCT/CA98/00117

§ 371 (c)(1),
(2), (4) Date: Apr. 12, 2000

(87) PCT Pub. No.: WO98/36490

PCT Pub. Date: Aug. 20, 1998

(30) Foreign Application Priority Data

Feb. 17, 1997 (GB) .............................................. 9703234

(51) Int. Cl.[7] .............................................. G01S 13/10
(52) U.S. Cl. ......................... 342/134; 342/82; 342/118; 342/124
(58) Field of Search .............................. 342/21, 22, 27, 342/28, 118–144, 175, 195, 202, 153, 82–103

(56) References Cited

U.S. PATENT DOCUMENTS

| | | | | | |
|---|---|---|---|---|---|
| 4,380,765 A | * | 4/1983 | Godfrey et al. | ............. | 342/153 |
| 4,884,077 A | * | 11/1989 | Landt | ......................... | 342/202 |
| 4,952,941 A | * | 8/1990 | Landt | ......................... | 342/202 |

* cited by examiner

Primary Examiner—Bernarr E. Gregory
(74) Attorney, Agent, or Firm—Ridout & Maybee

(57) ABSTRACT

A pulse-echo ranging system is described employing a microwave transducer head (100) providing an echo profile output signal which is largely compatible with receivers (204) and echo processing systems (206) designed for acoustic transducers. The transducer head employs novel microwave pulse generators (20a, 20b) each utilizing a microwave cavity (20a, 20b) excited by an avalanche discharge through a small signal diode (D2a, D2b) initiated by avalanche of a driver transistor (TR1a, TR1b) by a trigger pulse. Repeated pulse from one generator (2a) are transmitted by an antenna (12) towards a target, and return are mixed with pulses from the second generator (26) which are subject to a progressively swept delay relative to the transmitter pulses. The mixer output is applied to a tuned amplified (110) to extract components at an alias frequency related to the sweep rate of the delay relative to the transmitter frequency. The aliased signal is passed to a receiver (204) and echo processing system (206).

10 Claims, 2 Drawing Sheets

MICROWAVE PULSE GENERATOR AND PULSE-ECHO RANGING SYSTEM

This invention relates to microwave pulse generators and to pulse-echo ranging systems, such as are used for determining levels of material interfaces in tanks, silos, channels and bodies of liquid, using such generators.

One well known technique for such ranging utilizes pulses of acoustic energy which are echoed from the interfaces to be detected. The resolution of any such system is limited by the wavelength of the radiation utilized, and acoustic systems have the advantage that, particularly at ultrasonic frequencies, wavelengths are short, providing good resolution, while the speed of sound is comparatively low, facilitating processing of the echo signal in real time. On the other hand, the speed of sound is affected substantially both by temperature and the nature of the medium through which it passes, and the reflection and absorption characteristics of materials and their interfaces may not be satisfactory. For example, such systems often have difficulty in reliably detecting the surface of liquid covered with foam.

An alternative approach uses radar type techniques using pulses of microwave electromagnetic energy. The speed of propagation of such energy (the speed of light) is little affected by the temperature or composition of the propagation medium, and reflection characteristics are sufficiently different to enable some of the problems encountered with acoustic systems to be overcome. On the other hand, microwave wavelengths are such that extra high frequencies are needed to provide adequate resolution, and the very short echo times involved require quite different processing techniques. Furthermore, available microwave generators tend either to produce inadequate power, or to be unduly expensive and/or produce excessive power for typical short-range ranging applications, which require far less power than typical radar systems, but more than can be provided by semiconductor microwave oscillator components that are available at economically acceptable prices.

It is an object of the present invention to provide an economical microwave pulse generator capable of providing adequate power for industrial ranging applications, together with a ranging system utilizing such a generator which can utilize known ultrasonic receivers and signal processing techniques such that basically similar signa processing techniques, receivers and transducer wiring may be used for both microwave and acoustic operation, the acoustic transducers used in acoustic systems being replaced by more or less functionally equivalent microwave heads.

According to the invention, a microwave pulse generator comprises a reverse biased semiconductor P-N junction coupled into a microwave resonator, and a trigger circuit effective to initiate a non-destructive avalanche discharge through said junction. Further features of the invention will be apparent from the following description and the appended claims.

SHORT DESCRIPTION OF THE DRAWINGS

Figure 1:
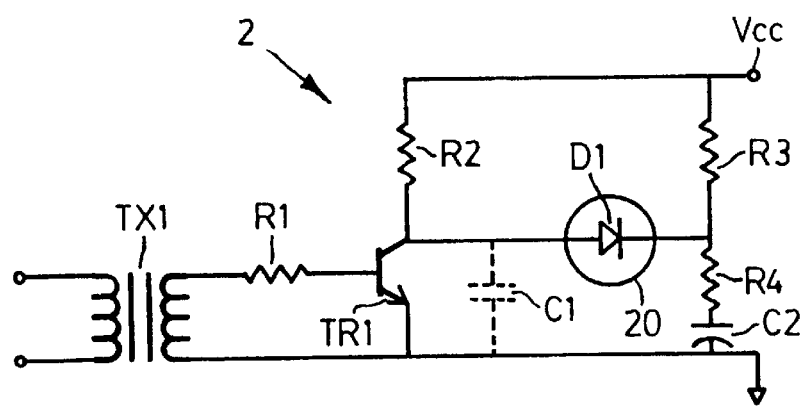
FIG. 1 is a schematic diagram of a microwave pulse generator in accordance with the invention.

Referring first to FIG. 1, a presently preferred embodiment of microwave pulse generator 2 in accordance with the invention comprises a transistor T1, which may be a conventional general purpose small signal planar silicon transistor such as sold under JEDEC designation 2N4401, and a diode D1 which may be a general purpose small signal planar silicon diode such as that sold under JEDEC designation 1N914. Such transistors and diodes are readily available at extremely low prices. The exact types used are not critical provided that both transistor and diode have reasonably predictable avalanche voltages typical of transistors and diodes of this general type. The generator is provided with a power supply having a voltage Vcc which is higher than the avalanche voltages exhibited by the semiconductors during operation, which are influenced in the case of the transistor by the base current, and in the case of the diode by the rate of fall of the transistor collector potential. The collector emitter breakdown potential of the transistor in the absence of base current should exceed Vcc. The emitter of transistor T1 is connected to the negative supply rail and the collector is connected to the positive rail Vcc through a high value resistor R2 such that collector-emitter leakage current through the transistor results in a voltage drop across R2 which reverse biases diode D1.

Firing pulses are applied to the base of the transistor TR1 through a pulse transformer TX1 and a resistor R1. The passage of base current in the transistor TR1 triggers an avalanche condition, the time constant of which is determined by the value of R2 and capacitance C1, which represents the sum of the collector-emitter capacitance of the transistor and the stray capacitance of the circuit. The collapse of the voltage at the collector of the transistor as the avalanche progresses in turn triggers an avalanche in the diode D1. The values of resistors R3 and R4 and capacitor C2 are selected to control avalanche current and duration through the diode and enable recovery of the diode cathode potential between pulses to a potential close to Vcc. The diode D1 is coupled to a resonator 20, whose resonant frequency is that of the desired microwave pulse to be generated. The resonator may be a cavity resonator within which the diode is located, but preferably the diode is located adjacent a dielectric resonator formed of a high dielectric constant ceramic such as barium nanotitanate. The avalanche of diode D1 produces a current transient through the diode that is coupled into the resonator to excite a microwave pulse. While the exact mechanism of operation has not been determined, it is possible that the diode may exhibit IMPATT (impact avalanche transit time) behavior, although experiments to date suggest that this may not be the dominant mechanism. The embodiment to be described uses a resonator providing a pulse frequency of 5.8 GHz, but we have found that when suitable resonators, pulses of frequencies at least up to 10 GHz can be generated. The actual frequency selected will normally be within a portion of the microwave frequency spectrum allocated for the type of application. The internal capacitance elements of the circuit are such that appreciable energy is stored therein at the onset of avalanche, enabling considerably higher pulse amplitudes to be obtained than from conventional microwave diodes which operate on much smaller voltage swings.

Figure 2:
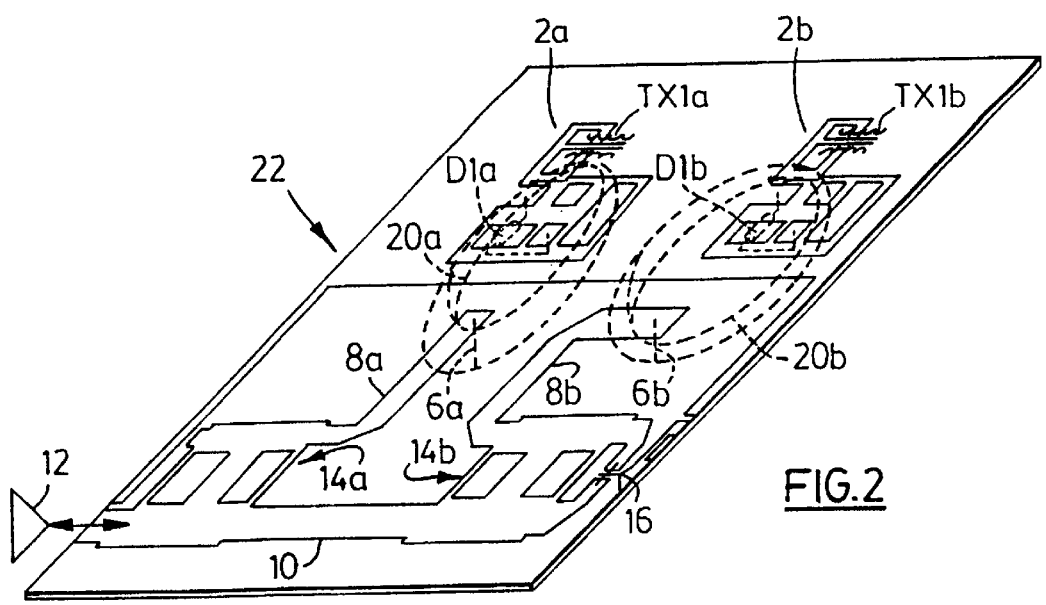
FIG. 2 is a perspective view of a microwave transceiver module incorporating pulse generators in accordance with the invention.

Referring now to FIG. 2, a microwave pulse transceiver 22 is shown incorporating two identical pulse generators 2a and 2b as described with reference to FIG. 1, corresponding parts being designated by the same reference numerals with the suffix "a" or "b" according to whether they belong to pulse generator 2a or 2b. The pulse generators are laid out on a printed circuit board 4, with the components except for the diodes D1*a* and D1*b* and resonators 20*a*, 20*b*, laid out on the top (as shown) surface of the board. The diodes are located beneath the board adjacent the resonators 20*a* and 20*b*. The resonators are coupled by probes 6*a*, 6*b* to strip lines 8*a*, 8*b* in turn coupled to a further stripline 10 connected to an antenna 12 through tuned circuits 14*a*, 14*b*. A mixer diode 16 is connected across circuit 14*b* to provide an output consisting of mixer products of the signals received from the antenna 12 and the generator 2*b*. The signals received from the antenna 12 are any echoes of the signals transmitted from the generator 2*a*, sampled at the mixer at a time interval after transmission of the pulse from generator 12*a* equal to a delay between the firing of the generators 12*a* and 12*b* as described further below.

Figure 3:
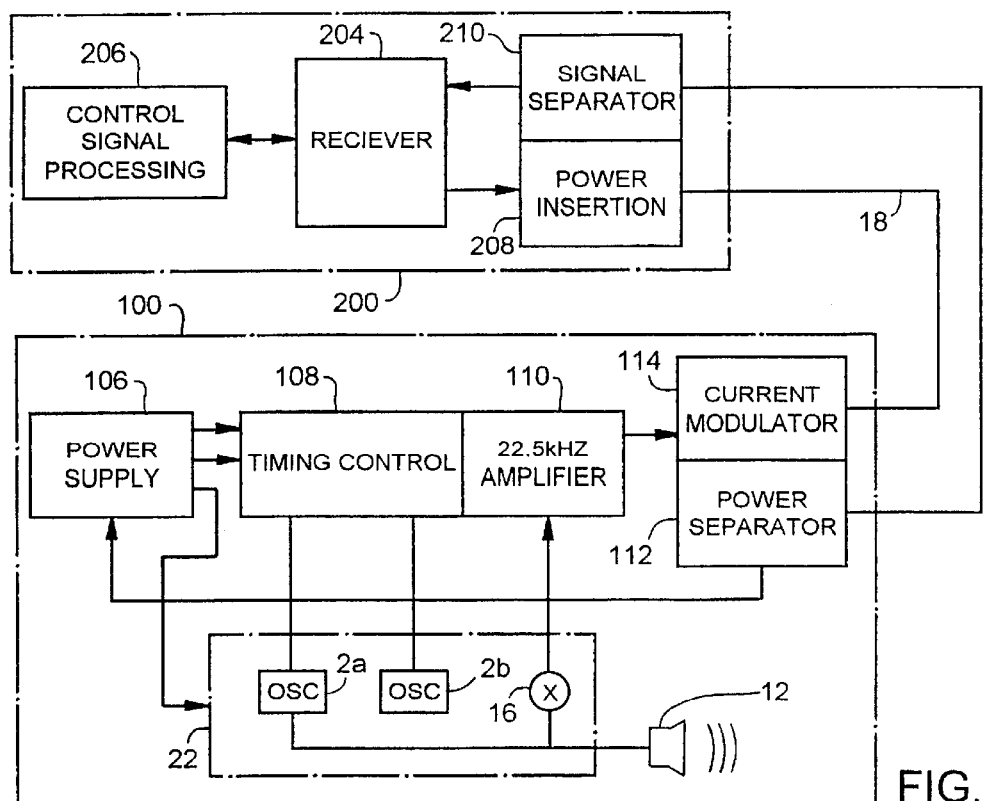
FIG. 3 is a block schematic diagram of a transceiver system incorporating the module of FIG. 2 and intended for pulse-echo ranging applications.
Figure 4:
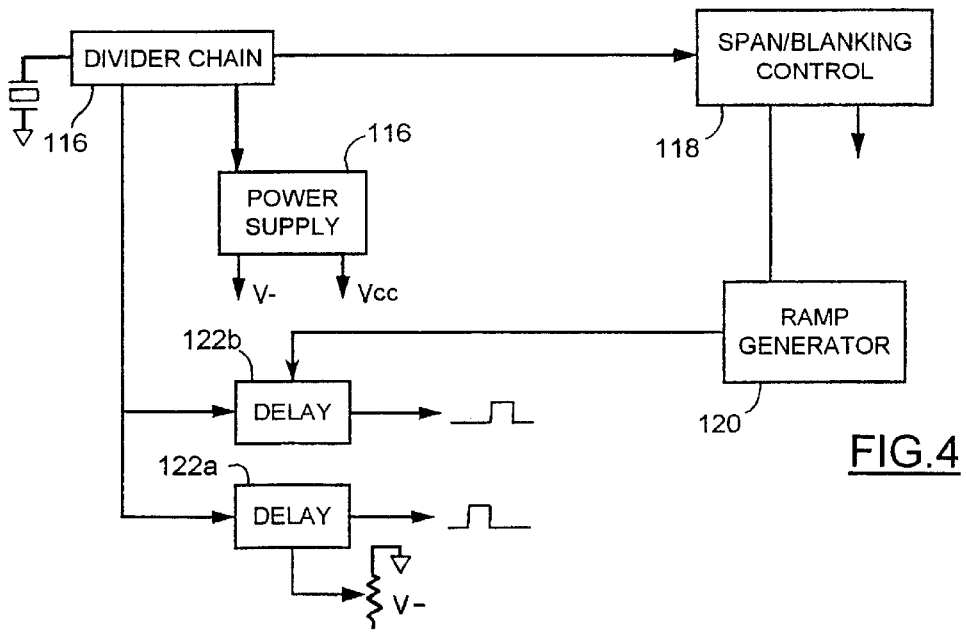
FIG. 4 is a block schematic diagram of the timing block of FIG. 3.

Referring now to FIG. 3, there is shown a microwave pulse-echo ranging system, comprising a transducer head 100 generally analogous to the transducer of an acoustic pulse-echo ranging system, and a receiver, power transmitting and signal processing unit 200 generally analogous to the transceiver and signal processing unit of such a system. The head 100 and the receiver unit 200 are connected, if not co-located, by a coaxial or twisted pair cable 14. In practice a number of heads 100 may be multiplexed to a single receiver unit by a suitable switching unit, as in the case of acoustic systems.

The transducer head 100 comprises a transceiver 102 and antenna 12 as described with reference to FIG. 3, an interface 104, a power supply unit 106, a timing control unit 108, and a tuned amplifier 110. The receiver unit comprises an interface 202, a receiver 204, and a signal processing unit 206. The receiver unit is generally similar to the transceiver units used in acoustic pulse-echo systems, such as described for example in U.S. Pat. No. 4,596,144, except that the transmitter pulse generating circuit is omitted or unused. DC power for powering the transducer head is applied to the cable 14 through the interface 202, which comprises a transformer 208 or alternative means to isolate an AC signal from the unit 200, the AC signal being superimposed on the DC signal on the cable 14, and a tuned preamplifier 210 to amplify and match this signal to the receiver 204. The DC potential applied to the cable in the example described is 15 volts.

The interface 104 uses a choke 112 to extract DC power from the cable 14 and apply it to the power supply unit 106, while a current modulation amplifier 114 is used to modulate the DC current on the cable 14 with a modulated 22.5 kHz signal from the tuned amplifier 110. The modulation amplifier also receives a blanking signal from the timing control unit, as described further below.

The power supply unit 106 comprises a filter for the 15 volt supply, a regulator circuit to provide a lower voltage supply for CMOS or other logic chips used in the circuit, and a switch mode high voltage supply to provide a high DC voltage, in this example 160 volts, to the transceiver 102.

The timing control unit 108 conveniently comprises a crystal controlled oscillator driving a divider chain 116, implemented by CMOS chips. In the example described, a 3.58 MHz crystal is divided to provide a frequency of approximately 450 kHz, a lower frequency to drive the switch mode high voltage supply, and a signal at about 13.7 Hz which is applied to a span and blanking control circuit 118, which provides a blanking signal at this repetition rate to the modulation amplifier 114, and a driver signal to a ramp generator 120. It will be understood that these various frequencies could be generated independently and asynchronously.

The 450 kHz signal is applied to two identical voltage controlled delay generators 122*a* and 122*b* using delay circuits implemented using matched transistors and including pulse shaping circuits. The circuit 122*a* receives a fixed bias from a potentiometer 124, and the circuit 122*b* a variable bias from the ramp generator 120. Since such voltage controlled delay generators are typically somewhat nonlinear, it is preferred to implement the ramp generator as an analog integrator, with feedback applied across the integrator to introduce non-linearity which cancels that of the delay generator 122*b*. The slope of the ramp generator is adjustable, in the present example so as to increase the delay applied by generator 122*b* by 8.6 picoseconds for each successive pulse. This delay maximizes the 22.5 kHz output from the amplifier 110, and therefore can be set by adjusting the ramp generator slope to maximize the 22.5 kHz output. The increasing delays applied to pulses from the generator 22*b* have an effect of making the trains of pulses from the two generators appear to the mixer as if they were samples from two coherent pulse trains having frequencies differing by 22.5 kHz, although in fact the pulses are independently triggered and the frequencies of the two generators need not be precisely equal. Any minor difference in frequency will be immaterial over the length of a short pulse.

In operation, with the transducer head 100 connected to the receiver unit 200, the divider chain 116 in the head 100 operates to generate 450 kHz pulses, and the high voltage generator in the power supply unit 106 applies 160 volts to the Vcc line of the pulse generators 2*a* and 2*b*. The potentiometer 124 applies a delay to the shaped 450 kHz pulses applied to the pulse transformer of the pulse generator 2*a*, which delay is short compared to the 2.2 microsecond elapsed time between pulses, and is adjusted by means of the potentiometer to provide a desired start-of-span point in relation to the delay produced in generator 2*b* by the ramp potential from ramp generator 120, at a point on the ramp providing a desired span, i.e. range of measurement. Over the 73 ms period of the ramp generator, and after the end of a blanking interval discussed further below, this results in firing pulses being applied to the pulse transformer generator 2*b* at a steadily increasing time lapse after pulses are applied to the generator 2*a*, although this time lapse will be short compared to the time interval between pulses.

When a trigger pulse is applied to the pulse transformer of one of the pulse generators 2*a* and 2*b*, and referring to FIG. 2, current begins to pass in the base of the transistor TR1, causing the avalanche potential of the collector emitter junction to fall below Vcc and initiating an avalanche discharge through the transistor, such that the collector potential collapses and in turn very rapidly increases the reverse bias on the diode D1, initiating an avalanche in the latter. The very rapid change of current in the diode is electromagnetically coupled into the resonator 20, generating therein a short pulse of microwave energy at the resonant frequency of the resonator. The duration of the avalanche discharge through the diode is limited by the fact that it does not comence until avalanche of the transistor is well advanced, and by various time constants of the pulse generator circuit, such as the values of R4 and C2, which influence how long the avalanche discharge through D2 can be maintained. Typically, these values may be adjusted to provide a pulse from the generator of five to ten cycles of microwave energy before the pulse amplitude has fallen away substantially. The pulses generated are characterized by a fast attack and an amplitude sustained for several cycles prior to exponential fall-off. In the case of generator 2*a*, the pulse is coupled to the directional antenna 12, which radiates it in a desired ranging direction, from whence it is reflected back to the antenna by material interfaces and other reflective features that it may encounter. Such reflected energy received by the antenna is applied to the mixer diode 16, which also receives a pulse of microwave energy from the generator 2b, timed according to the delay imposed by delay circuit 112b. Since successive pulses from the pulse generator 2b are subject to progressively increasing delay due to the action of the ramp generator 120 controlling the delay circuit, each successive pulse coincides with a successively later portion of the echo signal, so that over the span of the system, the output of the mixer represents a series of samples of successive echo profiles which "walk" through the profile and thus provide an alias of a single echo profile but on a greatly expanded time scale; in the case considered, the expansion is by a factor of about 250,000.

The amplifier 110 is tuned in the example described to a frequency of 22.5 kHz, i.e. one twentieth of the pulse repetition rate of the pulse generator 2a. This provides an intermediate frequency signal at 22.5 kHz which, over a period of 73 ms, is an alias at that frequency of the echo profile signal received at the antenna responsive to a single pulse over a period of 2.2 ms. In fact, the 22.5 kHz signal modulated onto the cable 14 may be blanked in the amplifier 114 of the interface 104 by the blanking signal from circuit 118.

The blanking signal if applied is arranged to blank the intermediate frequency signal, in the example shown, over a period of half the 73 ms cycle time provided for gathering an echo profile. This blanking interval includes an interval during which the ramp generator 120 is reset, and terminates just after the triggering of the pulse generator 20a, with the peak of the transmitted pulse, thus providing a readily identifiable commencement current of the aliased echo profile system.

The resulting aliased echo profile signal will be quite similar to that presented to the receiver input in an acoustic pulse-echo system such as that of U.S. Pat. No. 4,596,144, and thus similar receiver technology and echo-processing firmware can be used. There are however some significant differences that need to be appreciated. The translation of points on an acoustic echo profile into distance depends on the speed of sound, while microwaves travel at the speed of light. Because of the expansion factor mentioned above, the apparent speed of propagation will be reduced by this factor, but in the example considered is still about three times the speed of sound. In other words, the apparent speed of sound and thus the wavelength of the aliased 22.5 kHz signal is about three times that of an acoustic signal at the same frequency. Since the wavelength of the signal determines the resolution that can be obtained the resolution of the aliased microwave signal (whose apparent wavelength is not affected by the aliasing process) remains about 5.2 centimetres for a microwave frequency of 5.8 GHz, about three times that of the acoustic wavelength of a 22.5 kHz signal. Resolution for a given frequency is accordingly reduced by this factor. Resolution can be increased by utilizing a higher microwave frequency if a suitable frequency allocation is available, while the resolution disadvantage will be less for lower alias frequencies.

Secondly, the reflection and attenuation characteristics of microwave energy are different from those of acoustic signals. Attenuation due to atmospheric conditions is not a problem with microwaves, while reflection characteristics may be either superior or inferior according to application. These differences may of course be exploited to improve performance in circumstances where acoustic systems do not always perform satisfactorily, e.g. foam covered liquid interfaces, and very dusty atmospheres.

The lack of sensitivity to atmospheric composition and temperature eliminates the need for measuring temperature at the transducer unit, and for corrections for atmospheric composition. Performance is little affected by non-uniform atmospheric composition or temperature thus providing greater accuracy in such applications.

In the embodiment described, the 73 ms (13.7 Hz) cycles during which echo profiles are captured are initiated by the timing control unit 108, independently of the receiver unit 200. This enables existing two conductor (coaxial or twisted pair) cables, used to connect acoustic transducer heads, to be retained for use with microwave transducer heads, but means that the receiver must determine the start of a cycle by detecting the blanking periods in the received signal rather than itself initiating such a cycle by a transmitted signal, as in an acoustic system. By providing an additional conductor to transmit a cycle initiation signal to the transducer head, this difficulty can be overcome, and it would also be possible for the receiver unit to modulate an initiation signal onto the cable 14 during the blanking interval which signal could be detected at the transducer head and used to reinitialize the divider chain 116. This problem can also be overcome by integrating the transducer head and receiver unit into a single unit, which removes communication constraints, eliminates the need for interface circuits, and simplifies power supply requirements.

Processing of the received echo profile may use essentially similar techniques to whose which have been developed for recognizing wanted echoes from acoustic echo profiles, although signal processing algorithms may require optimization to allow for the different reflection characteristics of microwaves. While the parameter adjustments available in existing firmware may allow for suitable adjustments, it is possible to provide modified firmware optimized for microwave use, or to provide for both microwave or acoustic use using the same control unit.

The apparent frequency of the aliased signal may be varied through a wide range comparable to that of transducers used in acoustic ranging systems, for example 10 kHz to 100 kHz. As long as the microwave wavelength remains unchanged, the resolution will be unchanged, but while a change of alias frequency will not change resolution, the loss of resolution as compared to acoustic systems will be less for lower alias frequencies. By changing the ratio of the pulse repetition frequency and the alias frequency, the number of samples per cycle of the aliased signal can be changed.

It should also be understood that a microwave transducer head otherwise similar to that described could be implemented using alternative microwave pulse generators to those described, but it is believed that the pulse generators described presently present the most economical means for generating, at lost cost, microwave pules of adequate power to provide operating ranges comparable to known acoustic ranging devices. In this connection, the use of semiconductors having a reasonably high avalanche voltage is important in providing pulses at the enhanced power levels which are a valuable feature of the invention. The semiconductors exemplified typically have avalanche potential of the order of 120 volts, but with a power supply providing a Vcc to the pulse generators suitably higher than the avalanche potentials, semiconductors having higher or lower avalanche potentials may be used. In order to provide significantly higher power outputs than is attainable with conventional microwave device, the avalanche voltage must be substantially higher than the voltage being exhibited by such conventional device, and devices having an avalanche potential of at least 20 volts and preferably at least 50 volts are preferred.

It will be understood that, while the embodiment described applies a progressively increasing delay to the local oscillator pulses, equivalent results could be obtained by sweeping the delay in the opposite sense so that it is decreased rather than increased, or the transmitter pulses could be subjected to a swept delay rather than the local oscillator (receiver) pulses, or both could be swept in opposite directions. When measuring only relatively long ranges, it may be possible to use a single pulse generator to provide both pulse trains, provided that sufficient recovery time is available between pulses.

What is claimed is:

1. A microwave pulse generator, characterized in that it comprises a semiconductor, having a reverse biased P-N junction, coupled into a microwave resonator, and a trigger circuit incorporating the semiconductor and effective to initialize a transient non-destructive avalanche discharge through said junction of energy stored in the circuit and wherein the semiconductor P-N junction is provided by a small signal silicon junction diode.

2. The device according to claim 1, characterized in that the trigger circuit comprises a junction transistor having collector, emitter and base electrodes, said transistor and diode being connected into a potential divider circuit having a supply potential across it sufficient to avalanche said diode when subject to a rapidly increasing reverse bias, and to avalanche the transistor when current is passing in said base circuit, the potential divider circuit being such that, when no base current is passing in the transistor, the supply potential is divided across the transistor and diode and insufficient to avalanche either, but when base current passes in the transistor and the latter avalanches, the transistor rapidly short circuits part of the potential divider and avalanches the diode.

3. A microwave pulse transmitter, characterized in that it comprises a pulse generator according to claim 1 or 2, and an antenna coupled to said resonator.

4. A microwave transducer head, characterized in that it comprises first and second pulse generators, said pulse generators comprising a semiconductor, having a reverse biased P-N junction, coupled into a microwave resonator, and a trigger circuit incorporating the semiconductor and effective to initiate a transient non-destructive avalanche discharge through said junction of energy stored in the circuit and wherein the semiconductor P-N junction is provided by a small signal silicon junction diode, and means to trigger said pulse generators at a predetermined repetition frequency, the resonators of the pulse generators having approximately the same resonant frequency, an antenna coupled to said resonator of the first pulse generator, and to the resonator of said second pulse generator through a mixer having intermediate frequency output through an amplifier tuned to a specific frequency, the trigger circuit of the second pulse generator being timed to operate subsequent to the trigger circuit of said first pulse generator by a delay which varies linearly for successive pulses to provide an aliased frequency offset between the pulses from the two generators equal to the specific frequency, whereby to cause energy received by said antenna at the frequency of said first generator to be mixed with energy from said second generator by the mixer, to produce a signal at said intermediate frequency output which is a time-stretched alias of signals received by the antenna.

5. The microwave transducer head according to claim 4, characterized in that the trigger circuits for the pulse generators are similar and each includes voltage controlled delay circuits, one having a constant control voltage applied thereto, and the other having a linearly ramped control voltage applied thereto from a ramp generator.

6. The microwave transducer head according to claim 4, wherein said trigger circuit comprises a junction transistor having collector, emitter and base electrodes, said transistor and diode being connected into a potential divider circuit having a supply potential across it sufficient to avalanche said diode when subject to a rapidly increasing reverse bias, and to avalanche the transistor when current is passing in said base circuit, the potential divider circuit being such that, when no base current is passing in the transistor, the supply potential is divided across the transistor and diode and insufficient to avalanche either, but when base current passes in the transistor and the latter avalanches, the transistor rapidly short circuits part of the potential divider and avalanches the diode.

7. The microwave transducer head according to claim 6, characterized in that the trigger circuits for the pulse generators are similar and each includes voltage controlled delay circuits, one having a constant control voltage applied thereto, and the other having a linearly ramped control voltage applied thereto from a ramp generator.

8. A pulse-echo ranging system, comprising a receiver and echo-processing means for receiving the signal at the intermediate frequency output, identifying a wanted echo therein, and determining the range represented by the delay of the wanted echo, characterized in that the signal is received from a transducer head, said transducer head having first and second pulse generators, said pulse generators comprising a semiconductor, having a reverse biased P-N junction, coupled into a microwave resonator, and a trigger circuit incorporating the semiconductor and effective to initiate a transient non-destructive avalanche discharge through said junction of energy stored in the circuit and wherein the semiconductor P-N junction is provided by a small signal silicon junction diode, and means to trigger said pulse generators at a predetermined repetition frequency, the resonators of the pulse generators having approximately the same resonant frequency, an antenna coupled to said resonator of the first pulse generator, and to the resonator of said second pulse generator through a mixer having intermediate frequency output through an amplifier tuned to a specific frequency, the trigger circuit of the second pulse generator being timed to operate subsequent to the trigger circuit of said first pulse generator by a delay which varies linearly for successive pulses to provide an aliased frequency offset between the pulses from the two generators equal to the specific frequency, whereby to cause energy received by said antenna at the frequency of said first generator to be mixed with energy from said second generator by the mixer, to produce a signal at said intermediate frequency output which is a time-stretched alias of signals received by the antenna, and wherein the trigger circuits for the pulse generators are similar and each includes voltage controlled delay circuits, one having a constant control voltage applied thereto, and the other having a linearly ramped control voltage applied thereto from a ramp generator, and the range is determined on the basis that the wavelength of the received signal is equal to that of the microwave energy generated by the first pulse generator.

9. The pulse-echo ranging system according to claim 8, wherein said trigger circuit comprises a junction transistor having collector, emitter and base electrodes, said transistor and diode being connected into a potential divider circuit having a supply potential across it sufficient to avalanche said diode when subject to a rapidly increasing reverse bias, and to avalanche the transistor when current is passing in said base circuit, the potential divider circuit being such that, when no base current is passing in the transistor, the supply potential is divided across the transistor and diode and insufficient to avalanche either, but when base current passes in the transistor and the latter avalanches, the transistor rapidly short circuits part of the potential divider and avalanches the diode.

10. The pulse-echo ranging system according to claim 9, wherein the trigger circuits for the pulse generators are similar and each includes voltage controlled delay circuits, one having a constant control voltage applied thereto, and the other having a linearly ramped control voltage applied thereto from a ramp generator.

* * * * *